(12) United States Patent
Seningen et al.

(10) Patent No.: US 8,947,120 B2
(45) Date of Patent: Feb. 3, 2015

(54) LATCH ARRAY UTILIZING THROUGH DEVICE CONNECTIVITY

(75) Inventors: Michael R. Seningen, Austin, TX (US); Gregory D. Roberts, Austin, TX (US); Robert Kenney, Austin, TX (US); James De Leon, Austin, TX (US)

(73) Assignee: Apple Inc., Cupertino, CA (US)

( * ) Notice: Subject to any disclaimer, the term of this patent is extended or adjusted under 35 U.S.C. 154(b) by 230 days.

(21) Appl. No.: 13/613,184

(22) Filed: Sep. 13, 2012

(65) Prior Publication Data

US 2014/0070841 A1    Mar. 13, 2014

(51) Int. Cl.
   *H03K 19/173*    (2006.01)
(52) U.S. Cl.
   USPC .................................. 326/38; 326/41; 326/47

(58) Field of Classification Search
   None
   See application file for complete search history.

(56) References Cited

U.S. PATENT DOCUMENTS

| 7,080,299 B2 | 7/2006 | McLaurin |
| 7,421,610 B2 | 9/2008 | Mitra et al. |
| 7,911,221 B2 | 3/2011 | Yamaoka et al. |
| 2011/0239069 A1 | 9/2011 | Ramaraju et al. |
| 2014/0075401 A1* | 3/2014 | Seningen et al. ............. 716/106 |

* cited by examiner

*Primary Examiner* — Jany Richardson
(74) *Attorney, Agent, or Firm* — Meyertons, Hood, Kivlin, Kowert & Goetzel, P.C.

(57) ABSTRACT

A circuit for implementing latch array functions on an integrated circuit. Portions of the logic devices included in the implementation of the latch array functions that are controlled by a common signal, may be arranged in a particular alignment. A single layer uni-directionally conductive material may connect the common signal to the logic devices.

25 Claims, 12 Drawing Sheets

US 8,947,120 B2

LATCH ARRAY UTILIZING THROUGH DEVICE CONNECTIVITY

BACKGROUND

1. Technical Field

This invention is related to the field of integrated circuit implementation, and more particularly to the implementation of bit slice functions.

2. Description of the Related Art

Computing systems may include one or more systems on a chip (SoC), which may integrate a number of different functions, such as, graphics processing, onto a single integrated circuit. With numerous functions included in a single integrated circuit, chip count may be kept low in mobile computing systems, such as tablets, for example, which may result in a smaller form factor for such mobile computing systems.

During the design of an SoC, different functional blocks may have different design requirements. In some cases, a functional block may require a level of precision that may only be achieved through manual design. For example, in some radio frequency blocks, electrical characteristics of some transistors may need to be precisely matched. Such matching may require careful crafting of the mask design artwork necessary for a semiconductor manufacturing process.

Other blocks may be of such complexity that automated software design tools may be employed to implement such a block. Models written in a hardware description language may be used to describe blocks that are to be implemented with automated software design tools. In some cases, libraries of pre-designed and pre-characterized sub-circuits or standard cells, may be employed in the implementation of a functional block.

As performance goals continue to increase, some complex functional blocks may have additional design requirements. For example, a complex block may be required to operate a certain frequency or operate within a pre-determined power budget. In such cases, automated software design tools may not be adequate to achieve the desired performance or area goals.

SUMMARY OF THE EMBODIMENTS

Various embodiments of circuit implementing a latch array function on an integrated circuit are disclosed. Broadly speaking, circuit is contemplated in which a control signal is common to a number of standard cells included in data storage circuits, where the standard cells include a number of logic devices.

In one embodiment, portions of the logic devices are aligned such that the single layer conductive material unidirectionally connects the control signal to the logic devices. Polysilicon may be used, in a specific embodiment, as the single layer conductive material.

BRIEF DESCRIPTION OF THE DRAWINGS

The following detailed description makes reference to the accompanying drawings, which are now briefly described.

Figure 1:
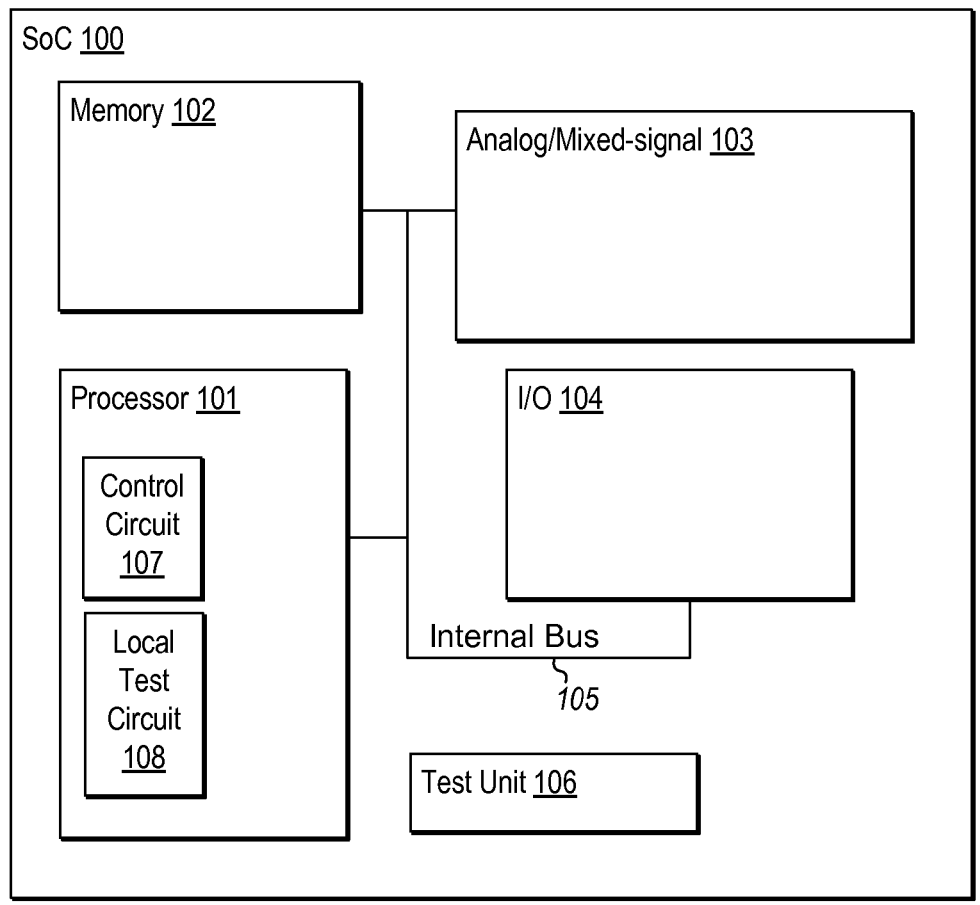
FIG. 1 illustrates an embodiment of a system on a chip.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component. More generally, the recitation of any element is expressly intended not to invoke 35 U.S.C. §112, paragraph six interpretation for that element unless the language "means for" or "step for" is specifically recited.

DETAILED DESCRIPTION OF EMBODIMENTS

A system on a chip (SoC) may include one or more functional blocks, such as, e.g., a microcontroller, which may integrate the function of a computing system onto a single integrated circuit. A functional block included in an SoC may be designed using a variety of design methods, such as standard cell, full-custom, or field-programmable gate array (FPGA), for example. In some cases, performance and area constraints may require the introduction of full-custom sub-assemblies into functional blocks implemented using a standard cell design method. The embodiments illustrated in the drawings and described below may provide techniques for the identification of logic functions that may be implemented using a full-custom design method, and then introduced into a functional block implemented using standard cells.

System on a Chip Overview

A block diagram of an SoC is illustrated in FIG. 1. In the illustrated embodiment, the SoC 100 includes a microprocessor 101 coupled to memory block 102, and analog/mixed-signal block 103, and I/O block 104 through internal bus 105. In various embodiments, SoC 100 may be configured for use in a mobile computing application such as, e.g., a tablet computer or cellular telephone.

Memory block 102 may include any suitable type of memory such as a Static Random Access Memory (SRAM), a Read-only Memory (ROM), Electrically Erasable Programmable Read-only Memory (EEPROM), or a FLASH memory, for example. It is noted that in the embodiment of an SoC illustrated in FIG. 1, a single memory block is depicted. In other embodiments, any suitable number of memory blocks may be employed.

Analog/mixed-signal block 103 may include a variety of circuits including, for example, a crystal oscillator, a phase-locked loop (PLL), an analog-to-digital converter (ADC), and a digital-to-analog converter (DAC) (all not shown). In other embodiments, analog/mixed-signal block 103 may be configured to perform power management tasks with the inclusion of on-chip power supplies and voltage regulators. Analog/mixed-signal block 103 may also include, in some embodiments, radio frequency (RF) circuits that may be configured for operation with cellular telephone networks.

I/O block 104 may be configured to coordinate data transfer between SoC 101 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, I/O block 104 may be configured to implement a version of Universal Serial Bus (USB) protocol or IEEE 1394 (Firewire®) protocol.

I/O block 104 may also be configured to coordinate data transfer between SoC 101 and one or more devices (e.g., other computer systems or SoCs) coupled to SoC 101 via a network. In one embodiment, I/O block 104 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, I/O block 104 may be configured to implement multiple discrete network interface ports.

SoC Design Flow Overview

The various functional blocks within SoC 100 may be designed using a variety of design flows. For example, memory block 102 or analog/mixed signal block 103, may be designed using a full-custom design flow so that precise sizing and matching of transistors in key circuits such as, e.g., sense amplifiers, may be obtained. In a full-custom design flow, a circuit designer may enter schematics into a schematics capture computer-aided design (CAD) tool. The schematics may be used to create netlists (text descriptions of circuit elements and connectivity) for simulation purposes. The schematics may also be used as a guide for creating mask design artwork necessary for fabricating the circuit on a semiconductor process. In some embodiments of the full-custom design flow, the mask design artwork for each transistor as well as the interconnection between the transistors is drawn manually, while in other embodiments, software aids, such as, device generators, for example, may be used to assist in the creation of the mask design artwork.

In some embodiments, one or more of the functional blocks within SoC 100 may be designed using standard cells. In such cases, full-custom design is limited to a set of basic logic gates (commonly referred to as "standard cells") that once designed are individually characterized to determine assorted electrical and timing parameters such as gate delay, and input capacitance, for example. The set of basic logic gates may include such logic functions as NAND, NOR, NOT, XOR, and the like. Other embodiments may allow for multiple gates with the same logic function but different drive strengths (a measure of how large a capacitive load the gate can drive).

In order to employ a standard cell based design flow, some embodiments may describe the operation of functional blocks using a register-transfer level (RTL) description of the blocks. In such designs, the logical operation of a block is described, using a hardware description language (HDL) such as, e.g., Verilog®, as transfer functions between sets of registers. A Verilog® description of a 5-bit counter is illustrated in example 1 below.

Example 1

Verilog Code for a Counter

```
module counter(rst, clk, enable, count)
parameter size = 5;
parameter length = 20;
input rst;
input clk;
input enable;
output [size-1:0] count;
reg [size-1:0] count;
always(@posedge clk or posedge rst)
    if(rst)
        count <= {size{1'b0}};
    else
    if (enable)
        begin
            if (count == length -1)
                count <= {size{1'b0}};
            else
                count <= count + 1'b1;
        end
endmodule
```

Figure 2:
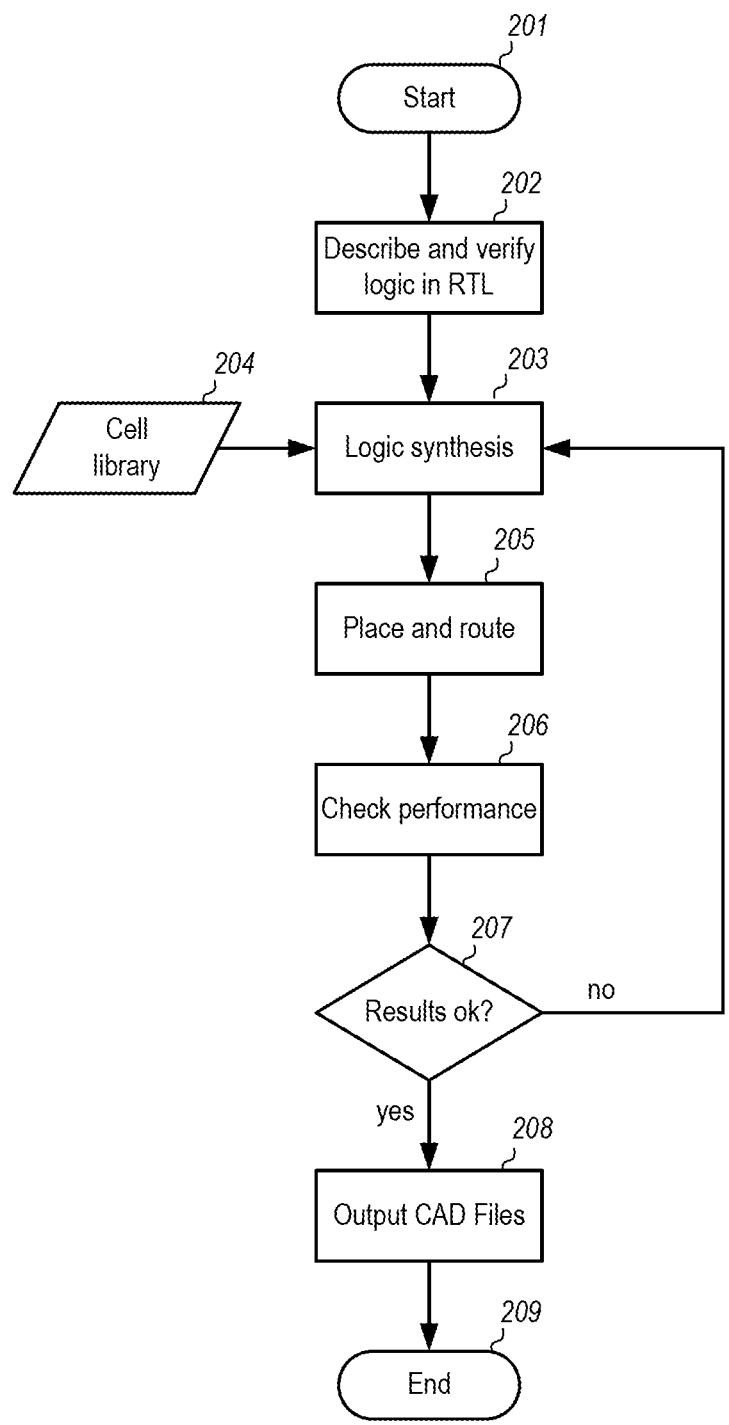
FIG. 2 illustrates a flowchart of an embodiment of a standard cell based design flow.

Turning to FIG. 2, a flowchart of an embodiment of a standard cell based design method is illustrated. The method begins in block 201. A RTL description of a logic block to be implemented is then generated (block 202). As described above with respect to example 1, the RTL description may be written in Verilog® or VHDL.

Once the RTL description has been written and verified, the RTL description may be mathematically translated into a netlist specific to a semiconductor process (block 203). This translation is typically referred to as "synthesis" and may be performed by one of many industry computer aided design (CAD) tools, such as Synopsys' Design Compiler® or Cadence's Encounter® RTL Compiler, for example.

When the RTL description is translated into a netlist, it may employ a standard cell library (block 204). As described further below, the standard cell library may include circuits to implement basic Boolean functions such as, e.g., AND, OR, XOR, etc., as well as more complicated sequential logic functions such as D-type flip-flops, for example. The standard cell library may include logic views (truth tables or state transition tables) as well as transistor levels netlists and mask design data for each cell. In some embodiments, the standard cell library may also include timing information for each cell stored in an industry standard format such a Synopsys liberty format, for example.

With the RTL description translated to a netlist by the synthesis software, the netlist is converted to mask design data (block 205) using place and route software such as Synopsys' IC Compiler, for example, which places individual standard cells and generates the required interconnect wiring. In some embodiments, the placement of individual standard cells may be performed using a simulated annealing algorithm or any other suitable placement algorithm. In other embodiments, some standard cells and their associated nets, e.g., standard cells related to the distribution of the system clock, may have pre-determined positions to reduce noise or jitter.

The performance of the resultant mask design data is then verified (block 206). The verification may include a design rule check (DRC) and a check of connectivity (commonly referred to as "layout versus schematic" or "LVS"). In some embodiments, performance parameters, such as maximum frequency of operation, for example, may be verified. During such verification, a parasitic extraction (PEX) may be performed on the mask design data to produce a netlist with estimated parasitic circuit elements, such as wiring resistance and capacitance, and transistor stress and strain parameters, for example. The parasitic netlist may then be simulated using a large-scale circuit simulator such as HSIM, or a static timing analysis tool such as PrimeTime.

The method is then dependent upon the verification results of the mask design data achieving a pre-determined goal (block 207). In some embodiments, the pre-determined goal may include a target frequency of operation, while in other embodiments, the pre-determined goal may include a maximum power dissipation goal, or a maximum area goal. When the pre-determined goal is not achieved, the RTL description may be re-synthesized using different initial conditions to allow for a different end result (block 203). In some embodiments, the different initial conditions may include additional cells in the standard cell library, alternative placement of clock buffers and clock routings, and the like.

When the pre-determined goal is achieved, output files for one or more CAD tools may be generated (block 208). The output files may include, in some embodiments, graphic database system II (GDSII) files and extracted netlists. In other embodiments, the output files may include various model files for top-level modeling, such as CeltIC ECHO files for top-level noise analysis, for example. The method then concludes in block 209. It is noted that the method illustrated in FIG. 2 is merely an example, and that in other embodiments, additional steps or a different order of steps may be possible.

Figure 3A:
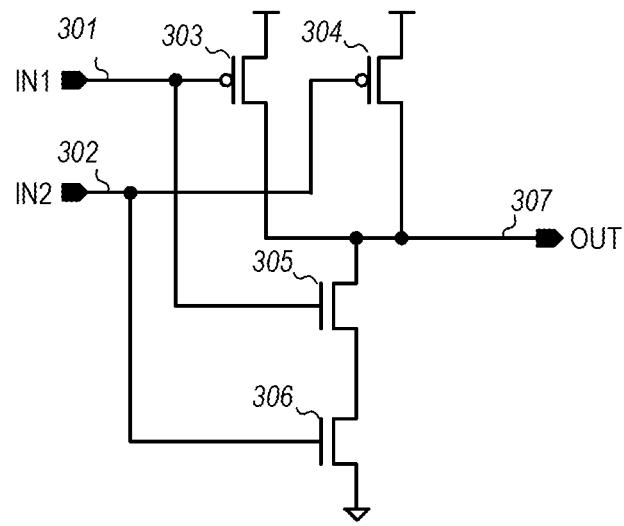
FIG. 3a illustrates an embodiment of a schematic of a standard cell.

Turning to FIG. 3A, a schematic diagram of an embodiment of a 2-input NAND standard cell is illustrated. As described in more detail below, the illustrated arrangement of transistors performs the logical NAND function using the two inputs IN1 301 and IN2 302. The schematic shown in FIG. 3A is merely an example of one type of logic gate that may be included in a standard cell library. In some embodiments, a standard cell library may also include circuits that perform logical inversion (INV), logical NOR, and logical exclusive-OR (XOR). Some circuits may be combined, to create additional logic functions. For example, a NAND gate may be combined with an inverter to created a logical AND function. A cell library may also include circuits that store data such as latches and flip-flops, for example, that are necessary to implement sequential logic circuits.

In order to perform the specified logic function, pull-up transistor 303, pull-up transistor 304, and pull-down transistor 305 are coupled to OUT 307. Pull-down transistor 305 is additionally coupled to pull-down transistor 306. Pull-up transistor 303 and pull-down transistor 305 are controlled by IN1 301, and pull-up transistor 304 and pull-down transistor 306 are controlled by IN2 302. It is noted that in various embodiments, a "transistor" may correspond to one or more transconductance elements such as a junction field-effect transistor (JFET), or a metal-oxide-semiconductor field-effect transistor (MOSFET), for example.

During operation, a low logic level on IN1 301 turns on pull-up transistor 303 and turns off pull-down transistor 305, which charges OUT 307 to a high logic level. A low logic level on IN2 302 turns on pull-up transistor 304 and turns off pull-down transistor 306, which also charge OUT 307 to a high logic level. When both IN1 301 and IN2 302 are both high, pull-up transistors 303 and 304 are both off, and pull-down transistors 305 and 306 are both on, discharging OUT 307 to a low. It is noted that in this embodiment, low refers to a voltage at or near ground potential and high refers to a voltage sufficiently large to turn on n-channel MOSFETs and turn off p-channel MOSFETs. In other embodiments, different circuit configurations may be used and the voltages that constitute a low logic level and a high logic level may be different.

Figure 3B:
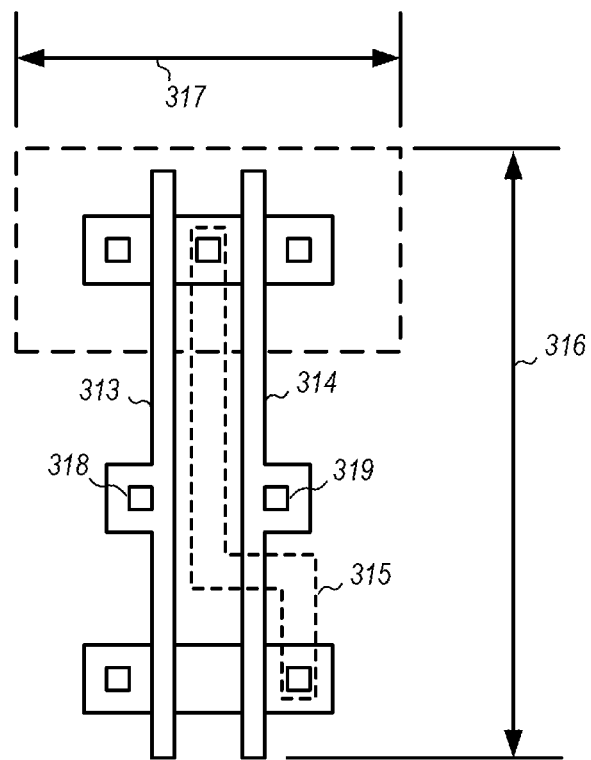
FIG. 3b illustrates a mask design diagram of an embodiment of a standard cell.

A diagram of the mask design for the embodiment of the 2-input NAND gate illustrated in FIG. 3A is depicted in FIG. 3B. It is noted that for the sake of clarity, many of the mask layers, such as threshold voltage boost implants and upper-level metal layers, have been omitted. The mask design for a standard cell may differ from a full-custom implementation in that all of the standard cells within a standard cell library may have the same height, such a height 316 of FIG. 3B. The height may be determined by the number of metal wires (commonly referred to as "tracks") that can be routed horizontally through the standard cell. Standard cell libraries are often characterized by the number of tracks the standard cells can support. With a fixed height, it may be necessary to use multiple transistors in parallel in order to accommodate larger transistor sizes. As such, each individual standard cell within a standard cell library may have a different width, e.g., width 317 of FIG. 3B.

Returning to the diagram of FIG. 3B, gate mask shape 313 may correspond to IN1 301 of FIG. 3A, and gate mask shape 314 may correspond to IN2 302 of FIG. 3A. In some embodiments, gate mask shapes 313 and 314 may be connected to other levels of metal wiring (not shown) through contacts 318 and 319, respectively. Gate mask shapes 313 and 314 may, in some embodiments, be used to fabricate a polysilicon layer, a high-k metal gate layer, or any other conductor layer suitable for creating a transistor gate. Metal-1 shape 315 may, in some embodiments, correspond to OUT 307 of FIG. 3A, and may be connected to other levels of metal wiring (not shown) through a via connection (not shown).

In the illustrated embodiment, gate mask shapes 313 and 314 do not extend beyond the bounds of the standard cell, and all connections into and out of the standard cell are accomplished through connections to other levels of metal wiring. In other embodiments, different connection methods, such as connections using the manufacturing layer corresponding to the gate mask, are possible and contemplated. The mask design illustrated in FIG. 3B is merely an example, and in other embodiments, different mask shapes and different arrangement of mask shapes may be possible.

Figure 4:
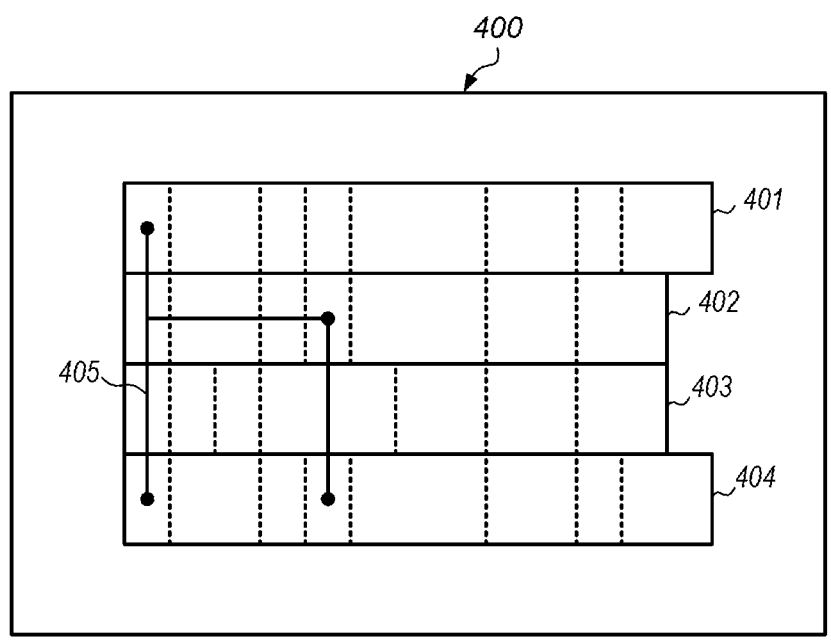
FIG. 4 illustrates a standard cell placement block diagram of an embodiment of a functional block.

Turning to FIG. 4, an embodiment of a possible placement of standard cells within a functional block is illustrated. Functional block 400 includes four rows of standards cells, row 401, row 402, row 403, and row 404. Each row may include multiple standard cells and, in some embodiments, each row may be a different length due to the varying widths of standard cells within a standard cell library. As described above, the placement of each standard cell may be determined by a place and route CAD tool and the final placement of the standard cells may require multiple placement iterations before desired performance levels may be achieved.

Once the standard cells have been placed, connections between the various standard cells, e.g., connection 405 may then be implemented. It is noted that for the sake of clarity, only one connection has been depicted in FIG. 4. In other embodiments, numerous connections between standard cells may be possible. The path or route of connection 405 may be determined using a minimum spanning tree algorithm, or any other suitable path-based algorithm such as, e.g., Prim's algorithm. In some embodiments, the cost or weight of each connection in the tree may be a function of distance or type of wiring material. The placement of standard cells and their associated wiring illustrated in FIG. 4 is merely an example. In other embodiments, different number of rows and standard cells, as well as different wiring routes may be possible.

Implementation of Bit Slice Functions

Within an SoC design, logic or functional blocks implemented using a standard cell based design method may contain assorted types of logic circuits. For example, a logic block may contain a sequential logic circuit such as a counter, for example. In some embodiments, a logic block may contain a logic circuit where individual bit fields of a wide logic word are operated on in parallel using similar groups of logic gates. Such logic circuits are commonly referred to as bit slice circuits. For example, a 16-bit arithmetic logic unit (ALU) may be constructed from sixteen slices of a basic ALU structure, each slice operating on a different bit of the 16-bit wide word.

Figure 5:
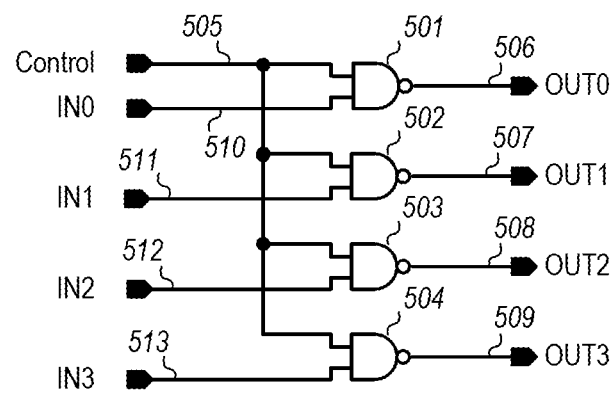
FIG. 5 illustrates a schematic diagram of an embodiment of a bit slice function.

In some embodiments, bit slice circuits may share a common control signal that is coupled to each logic gate across the word width. The control signal may be, in some embodiments, a clock or enable signal, while in other embodiments, the control signal may be a scan or test signal. A schematic diagram of an embodiment of a bit slice logic circuit with a shared control signal is illustrated in FIG. 5. In this illustrated example, four NAND gates designated 501 through 504 each operate on a single bit of a 4-bit data word (IN0 510 through IN3 513) to create a new 4-bit data word as output (OUT0 506 through OUT3 509). Control 505 is a common input signal to each of NAND gates 501 through 504. In some embodiments, each of NAND gates 501 through 504 may be constructed in a similar fashion to the embodiments illustrated in FIG. 3A and FIG. 3B.

During operation, when control 505 is low, OUT0 506 through OUT3 509 are unconditionally set high. When control 505 is high, the states of outputs OUT0 506 through OUT3 509 are dependent upon the states of the inputs IN0 510 through IN3 513, respectively. For example, when IN0 510 and control 505 are both high, OUT0 506 is low. It is noted that the bit slice logic circuit illustrated in FIG. 5 is merely an example, and that in other embodiments, different logic gates, different numbers of logic gates, and different arrangement of logic gates are possible.

In the RTL description of a functional block in an SoC design, there may be code that describes one or more bit slice functions such as the bit slice function illustrated in FIG. 5, for example. In example 2, Verilog® code for an embodiment of a bit slice NAND function is illustrated. In some embodiments, the Verilog® code illustrated in example 2 may correspond to the schematic diagram illustrated in FIG. 5. It is noted that the Verilog® code illustrated in example 2 is merely an example, and that in other embodiments, different coding styles as well as different HDL languages are possible and contemplated.

Example 2

Verilog® Code for Bit Slice NAND

```
module bit_slice_nand(in,out,control)
input control;
input [3:0] in;
output [3:0] out;
assign out[0] = in[0] & control;
assign out[1] = in[1] & control;
assign out[2] = in[2] & control;
assign out[3] = in[3] & control;
endmodule
```

Figure 6:
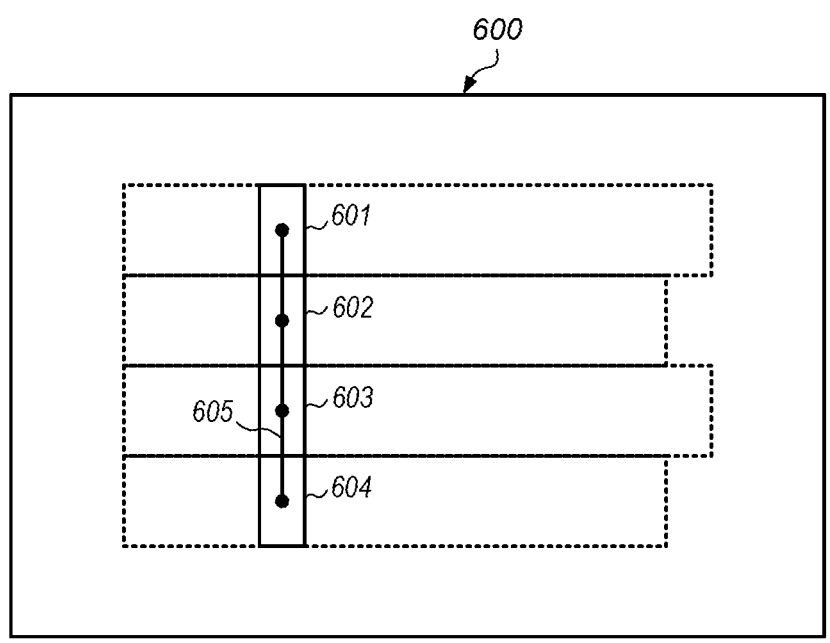
FIG. 6 depicts a standard cell placement block diagram of the embodiment illustrated in FIG. 5.

During the place and route portion of a standard cell based design flow, such as block 205 of the design method illustrated in FIG. 2, for example, logic gates included in a bit slice logic circuit may be placed in many different arrangements. For example, the gates may be placed in a fashion similar to how the standard cells were placed in the embodiment illustrated in FIG. 4. A possible placement of the logic circuit embodiment illustrated in FIG. 5, is depicted in FIG. 6. In the illustrated placement, NAND gates 501 through 504 are placed in logic block 600 at positions 601 through 604, respectively. Control 505 may then be routed along path 605 as illustrated in FIG. 6. It is noted that in other embodiments, one or more of NAND 501 through 504 may be placed in other standard cells rows within logic block 600.

Figure 7:
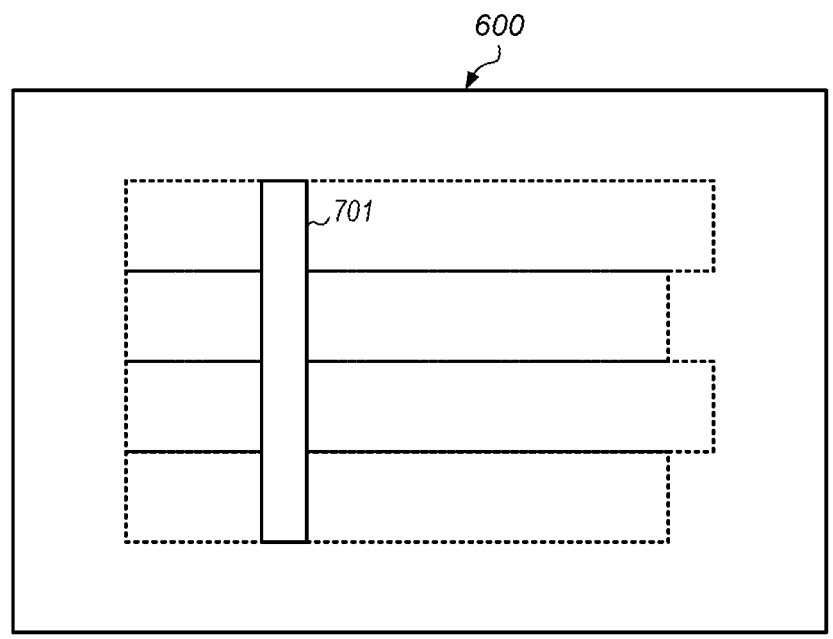
FIG. 7 depicts an alternative cell placement block diagram of the embodiment illustrated in FIG. 5.

An alternative placement of the logic circuit embodiment illustrated in FIG. 5 is depicted in FIG. 7. In the illustrated placement, the logic circuit of FIG. 5 has been consolidated into a single standard cell 701. As described below in more detail, the single standard cell may be the height of two or more standard cell rows. In some embodiments, the RTL description of the logic block may be modified to specifically instantiate the single standard cell 701 as opposed to the synthesis software selecting NAND gates 501 through 504 to implement the function. It is noted that in other embodiments, one or more bit slice logic functions, or portions thereof, may be implemented as single standard cells.

Figure 8:
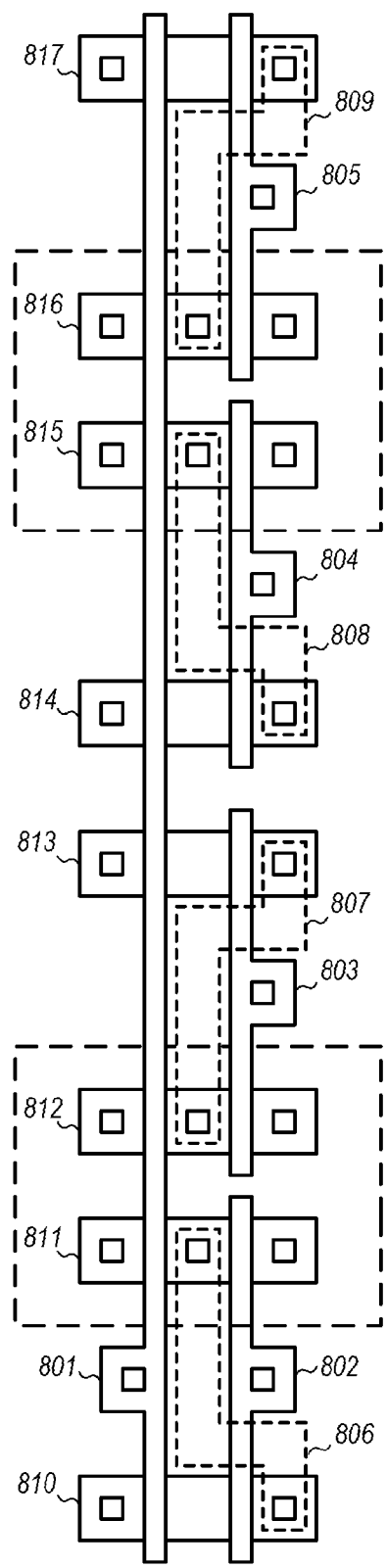
FIG. 8 illustrates a mask design diagram of an embodiment of a standard cell.

A possible embodiment of the mask design for single standard cell 701 is illustrated in FIG. 8. In this embodiment, mask designs of four 2-input NAND gates, such as the embodiment of a NAND gate illustrated in FIG. 3A and FIG. 3B, have been placed vertically in an end-to-end fashion. The mask design for each of the 2-input NAND gates may be aligned such that diffusion shapes 809 through 816 are vertically aligned. Polysilicon shapes 802, 803, 804, and 805 may, in some embodiments, correspond to IN0 510, IN1 511, IN2 512, and IN 513 of FIG. 5, respectively. Metal-1 shapes 806 through 809 may, in some embodiments, correspond to OUT0 506, OUT1 507, OUT2 508, and OUT3 509 of FIG. 5, respectively.

In the illustrated embodiment, control 501 of FIG. 5 is routed as a single polysilicon wire (polysilicon shape 801), using through device routing, i.e., a polysilicon gate is allow to extend beyond its associated diffusion to form a connection to another polysilicon gate. Furthermore, control 501 is routed in a single direction (referred to here as "uni-directionally"). Such routing may allow for a single connection from a metal layer to the gate connections of one or more MOSFETs. While control 501 is shown as being routed on the polysilicon layer in the embodiment illustrated in FIG. 8, in other embodiments, different mask layers may be available in the semiconductor manufacturing process, such as, e.g., a tungsten wiring layer, and may be used to perform the through device routing. In some embodiments, specialized mask design rules for the semiconductor manufacturing process may be used in order to perform the through device routing. The mask design illustrated in FIG. 8 is merely an example, and in other embodiments, different mask shapes and configurations of mask shapes are possible and contemplated.

Figure 9:
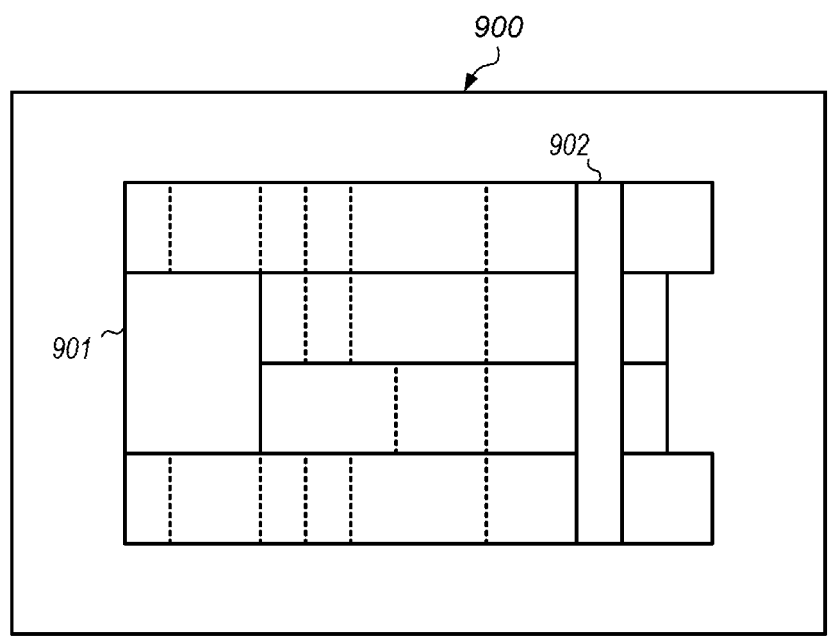
FIG. 9 illustrates a standard cell placement of an embodiment of a functional block.

A variety of bit slice circuits may be implemented as single standard cells within a functional block of an SoC. FIG. 9 illustrates an embodiment of a functional block within an SoC that includes two bit slice circuits that have been implemented as single standard cells (blocks 901 and 902). In some embodiments, blocks 901 and 902 may correspond to a collection of 2-input NAND gates such as the collection illustrated in FIG. 5. In other embodiments, blocks 901 and 902 may correspond to a collection of latches implemented as a single standard cell consisting of an array of latch cells. In such an embodiment, RTL of the functional block may include multiple instances of code that may map to latches in a standard cell library. An example of a portion of Verilog® code description of a functional block with multiple latches is shown in example 3. Each of the latch structures (each latch begins with "always @") is dependent upon the signal "clk," thus "clk" is a signal that is common to each of the latch instances. It is noted that in example 3, for the sake of clarity, only the portions of the Verilog® code relevant to the latches is shown.

Example 3

Verilog Code for a Functional Block with Latches

```
module functional_block(in,out,clk)
input clk;
input [3:0] in;
output [3:0] out;
reg out;
always @ (input[0] or clk)
    if(clk)
        out[0] = input[0];
always @ (input[1] or clk)
    if(clk)
        out[1] = input[1];
always @ (input[2] or clk)
    if(clk)
        out[2] = input[2];
always @ (input[3] or clk)
    if(clk)
        out[3] = input[3];
endmodule
```

Since the latch instances shown in example 3 share "clk" as a common signal, the instances may be consolidated into a single standard cell, such as, e.g., the cell latch_array, using a method that will be described in more detail below. Once a new standard cell has been created, it may be necessary to instantiate the new standard cell in the original RTL description of the functional block. Example 4 illustrates a method for modifying Verilog® code to instantiate the new latch_array standard cell. In the example, the previous latch instances have been deleted and replaced with a call to the module latch_array.

In some embodiments, a synthesis tool may attempt to find a further definition for the module latch_array, such as additional HDL code describing the behavior and operation of the latch_array module. When a further definition is not found, the synthesis tool may then map the latch_array module to a standard cell that may be included in the standard cell library and use the standard cell to complete logic synthesis of the functional block.

Example 4

Verilog Code for a Functional Block with New Standard Cell Instance

```
module functional_block(in,out,clk)
input clk;
input [3:0] in;
output [3:0] out;
reg out;
latch_array(out,in,clk);
endmodule
```

Figure 10:
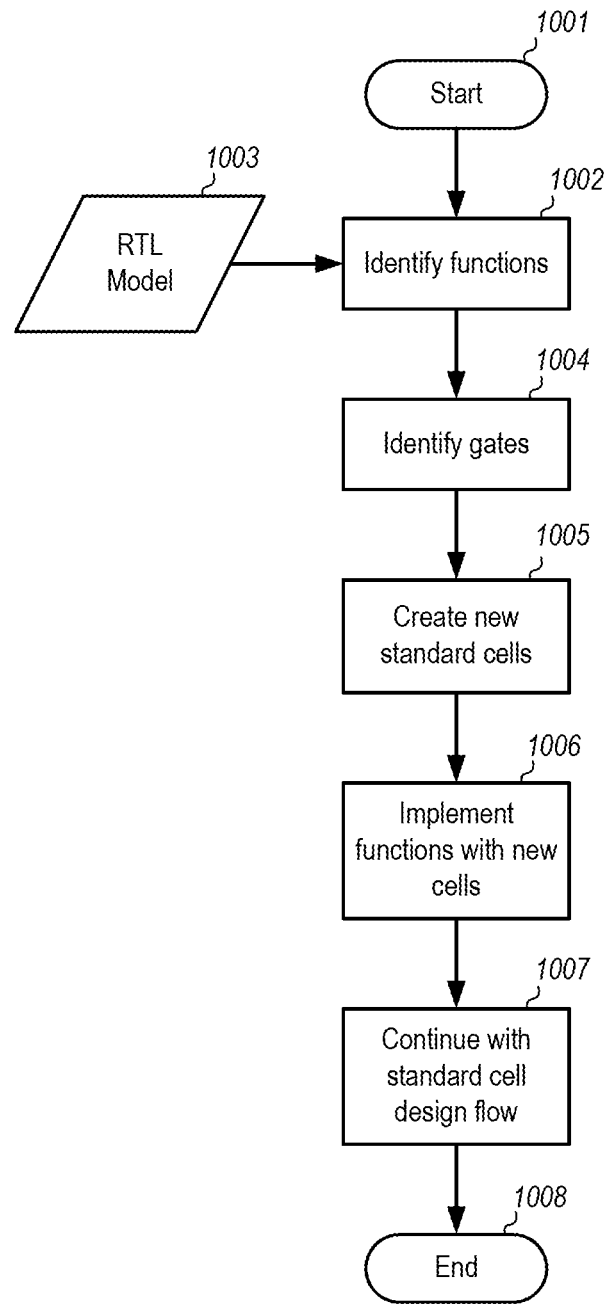
FIG. 10 illustrates a flowchart of a method of implementing bit slice logic functions.

A flowchart of a method for implementing bit slice functions in a logic block is illustrated in FIG. 10. The method begins in block 1001. Logic functions that have common control signals are then identified (block 1002) by examining the RTL description (block 1003) of the logic block. As described above, the RTL description may be written in Verilog, VHDL, or any other suitable hardware description language. In some embodiments, the identification may be performed manually, while in other embodiments, a script written in Perl, Python, or any other suitable scripting language, may be used to identify the logic functions.

Within the identified logic functions, logic gates are grouped in accordance with which of the common control signals they use as an input (block 1004). As with the previously described identification process, the grouping process may be performed manually or with the assistance of a script or software tool.

A new standard cell is then created for each of the previously identified groups of logic gates (block 1005). As will be described in more detail below in reference to FIG. 11, the process of creating each new standard cell may include generating a schematic and mask design of the new cell. In some embodiments, each new standard cell may be characterized to determine performance, noise sensitivity, etc.

Once the new standard cells have been created, the previously identified logic functions may then be implemented using the new standard cells (block 1006). In some embodiments, the implementation may include modifying the RTL model (block 1003) to specifically instantiate the new standard cells in the RTL model. For example, as described above, Verilog® code describing an array of latches may be replaced with a specific call within the Verilog® model to a latch-array standard cell. The modifications to the RTL model may be performed manually or in a more automated way such as through the use of a script or other suitable software tool.

With the inclusion of the new standard cells in the RTL model, a standard cell design flow such as the flow described above with respect to FIG. 2, may then continue (block 1107). In some embodiments, the placement of the new standard cells may be defined prior to starting the place and route portion of the standard cell design flow while, in other embodiments, the placement of the new standard cells may be left to the place and route software tool. With the completion of the standard cell design flow, the method for implementing bit slice functions ends in block 1008.

The method illustrated in FIG. 10 is merely an example of a method of implementing bit slice functions in a standard cell design flow. In other embodiments, the illustrated operations may be executed in a different order, and the inclusion of different operations is possible and contemplated.

Figure 11:
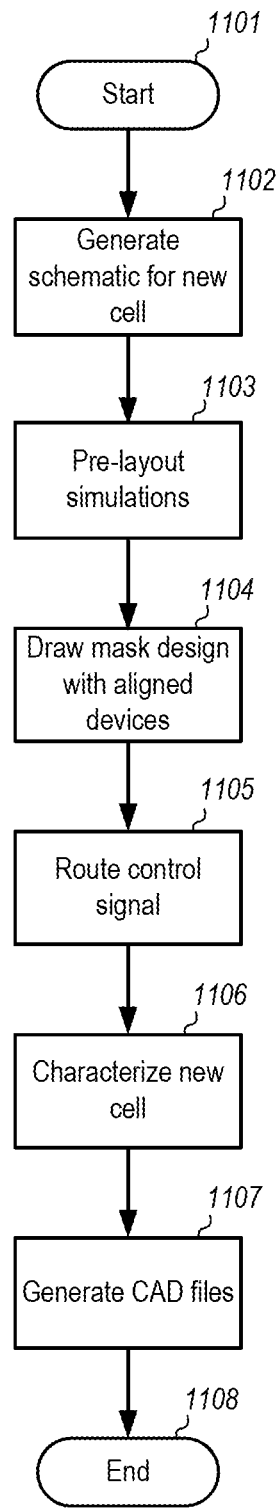
FIG. 11 illustrates a flowchart of a method of generating a standard cell for a bit slice logic function.

A flowchart of an embodiment of a design method for creating a new standard cell, such as latch array 901 in FIG. 9, is illustrated in FIG. 11. The design method begins in block 1101. A schematic may then generated for the new standard cell (block 1102). The schematic may then be generated using an industry standard tool such as Cadence Virtuoso®, or any other suitable schematics capture CAD tool.

Once a schematic has been generated for the new standard cell, pre-layout simulations may be performed (block 1103) to verify proper operation and to provide an estimate of circuit performance. The pre-layout simulations may be performed using a transistor-level simulation such as, HSPICE or HSIM, for example. Dependent upon the results of the pre-layout simulations, adjustments to the sizes of transistors included in the new standard cell may be made to achieve desired performance goals.

With the pre-layout simulations complete, the mask design of the new standard cell may then be drawn (block 1104). In some embodiments, the diffusion of transistors, whose gates are connected to the same electrical net, may be aligned. The mask design may be drawn using a CAD tool such as Cadence Virtuoso®, for example. In other embodiments, the mask design may be checked for compliance to the design rules of a semiconductor manufacturing process. Additionally, the mask design may also be checked to verify the connectivity of the circuit.

Once the mask design for the new standard cell has been drawn and verified, the new standard cell may be characterized (block 1106). In some embodiments, the characterization may include running transistor-level circuit simulations to determine the delay through the new standard cell. The simulations may be run using a variety of input slew rates for the input signals as well as a variety of output loads. In other embodiments, simulations may be performed to determine the active and leakage power of the new standard cell. Additionally, statistical simulations (commonly referred to as "Monte Carlo simulations") may be performed to determine the electrical performance of the new standard cell over the range of possible variation of a semiconductor manufacturing process.

Using data gathered during the simulations performed as part of the characterization of the new standard cell, output files for CAD tools may be generated (block 1107). In some embodiments, the output files may include timing files, such as a Synopsys liberty file, for example. A noise model file or a gate-level Verilog file may also be generated in some embodiments. When the necessary CAD tool files have been generated, the method ends in block 1108. It is noted that the design method illustrated in FIG. 11 is merely an example, and that in alternative embodiments, the individual operations may occur in a different order or simultaneously.

Figure 12:
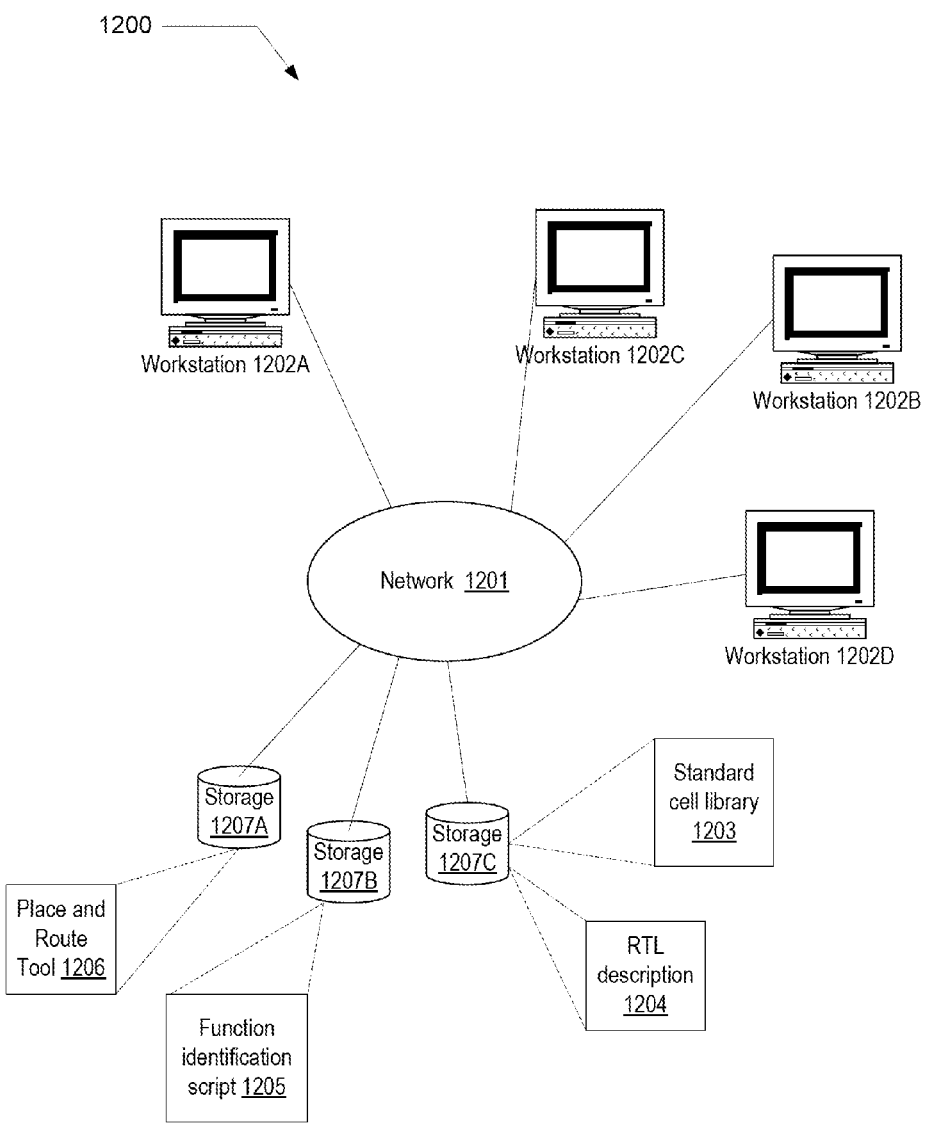
FIG. 12 illustrates an embodiment of a computing system.

Turning to FIG. 12, a block diagram of one embodiment of a computer system including integrated circuit design tool is illustrated. The computer system 1200 includes a plurality of workstations designated 1202A through 1202D. The workstations are coupled together and to a plurality of storage devices designated 1207A through 1207C through a network 1201. In one embodiment, each of workstations 1202A-1202D may be representative of any standalone computing platform that may include, for example, one or more processors, local system memory including any type of random access memory (RAM) device, monitor, input/output (I/O) means such as a network connection, mouse, keyboard, monitor, and the like (many of which are not shown for simplicity).

In one embodiment, storage devices 1207A-1207C may be representative of any type of mass storage device such as hard disk systems, optical media drives, tape drives, ram disk storage, and the like. As such, program instructions comprising the design tools such as the place and route tool may be stored within any of the storage devices 1207A-1207C and loaded into the local system memory of any of the workstations during execution. As an example, as shown in FIG. 12, a place and route tool 1206 is shown stored within storage device 1207A, while a RTL description 1204 and a standard cell library 1203 are stored within storage device 1207C. Further, the function identification script is stored within storage device 1207B. In one embodiment, the standard cell characterization script may be invoked manually, or invoked automatically using additional program instructions such as scripting instructions.

Additionally, the function identification script may be stored on a portable/removable storage media. The function identification script may be executed directly from the removable media or transferred to the local system memory or mass storage devices 1207 for subsequent execution. As such, the portable storage media, the local system memory, and the mass storage devices may be referred to as non-transitory computer-readable storage mediums. The function identification script may be executed by the one or more processors on a given workstation or the script may be executed in a distributed fashion among the workstations, as desired.

Numerous variations and modifications will become apparent to those skilled in the art once the above disclosure is fully appreciated. It is intended that the following claims be interpreted to embrace all such variations and modifications.

What is claimed is:

1. A latch array, comprising:
a circuit configured to generate a control signal; and
a plurality of standard cells configured to receive and store data;
wherein respective portions of a plurality of logic devices included in the plurality of standard cells that are coupled to the control signal are aligned; and
wherein the control signal is routed using a single layer conductive material uni-directionally to interconnect the plurality of logic devices.

2. The latch array of claim 1, wherein the control signal is a clock.

3. The latch array of claim 1, wherein the conductive material is polysilicon.

4. The latch array of claim 1, wherein the conductive material is a high-k metal gate material.

5. The latch array of claim 1, wherein the respective portions of the plurality of logic devices comprise a plurality of diffusion mask shapes that correspond to source and drain regions of the plurality of logic devices.

6. A system, comprising:
a processing unit, and
one or more latch arrays, wherein each of the latch arrays comprises:
a circuit configured to generate a control signal; and
a plurality of latch circuits configured to receive and store data;
wherein respective portions of a plurality of logic devices included in the plurality of latch circuits that are coupled to the control signal are aligned; and wherein the control signal is routed using a single layer conductive material uni-directionally to interconnect the plurality of logic devices.

7. The system of claim 6, wherein the single layer conductive material is polysilicon.

8. The system of claim 6, wherein the control signal is a clock signal.

9. The system of claim 6, wherein respective portions of the plurality of logic devices comprises a plurality of diffusion mask shapes that correspond to source and drain regions of the plurality of logic devices.

10. The system of claim 9, wherein the respective portions of the plurality of logic devices further comprises a plurality of polysilicon mask shapes that correspond to gate regions of the plurality of logic devices.

11. A bit slice logic circuit, comprising:
a circuit configured to generate a control signal; and
a plurality of logic gates, wherein each given logic gate is configured to operate on a respective portion of a data word;
wherein respective portions of a plurality of logic devices included in the plurality of gates that are coupled to the control signal are aligned; and
wherein the control signal is routed using a single layer conductive material uni-directionally to interconnect the plurality of logic devices.

12. The bit slice logic of claim 11, wherein the single layer conductive material is polysilicon.

13. The bit slice logic of claim 11, wherein each logic device of the plurality of logic devices is a metal-oxide-semiconductor field-effect transistor (MOSFET).

14. The bit slice logic of claim 13, wherein the respective portions of the plurality of logic devices comprises a plurality of diffusion mask shapes that correspond to source and drain regions of the MOSFETs.

15. The bit slice logic of claim 11, wherein the single layer conductive material is high-k metal gate material.

16. A system, comprising:
a processing unit;
a test unit configured to generate a global test signal; and
a plurality of bit slice functional blocks, wherein each bit slice functional block comprises:
a local test circuit configured to generate a local test signal dependent upon the global test signal;
a plurality of logic gates, wherein each give logic gate is configured to operate on a respective portion of a data word;
wherein respective portions of a plurality of logic devices included in the plurality of gates are coupled to the local test signal are aligned; and
wherein the local test signal is routed using a single layer conductive material uni-directionally to interconnect the plurality of logic devices.

17. The system of claim 16, wherein the single layer conductive material is high-k metal gate material.

18. The system of claim 16, wherein the test signal is a scan clock signal.

19. The system of claim 16, wherein each logic device of the plurality of logic devices is a metal-oxide-semiconductor field-effect transistor (MOSFET).

20. The system of claim 19, wherein the respective portions of the plurality of logic devices comprises a plurality of diffusion mask shapes that corresponds to source and drain regions of the MOSFETs.

21. An apparatus, comprising:
a control unit [or circuit] configured to generate a control signal; and
a plurality of standard cells configured to receive and store data, wherein the plurality of standard cells includes a plurality of logic devices coupled to the control signal; and
wherein respective portions of the plurality of logic devices include a particular alignment such that a single layer conductive material uni-directionally interconnects the control signal to the plurality of logic devices.

22. The apparatus of claim 21, wherein the control signal is a clock signal.

23. The apparatus of claim 21, wherein the single layer conductive material is polysilicon.

24. The apparatus of claim 21, wherein the respective portions of the plurality of logic devices comprises a plurality of diffusion mask shapes that corresponds to source and drain regions of the plurality of logic devices.

25. The apparatus of claim 21, wherein the control signal is a scan clock signal.

* * * * *

UNITED STATES PATENT AND TRADEMARK OFFICE
CERTIFICATE OF CORRECTION

| | | |
|---|---|---|
| PATENT NO. | : 8,947,120 B2 | Page 1 of 1 |
| APPLICATION NO. | : 13/613184 | |
| DATED | : February 3, 2015 | |
| INVENTOR(S) | : Michael R. Seningen et al. | |

It is certified that error appears in the above-identified patent and that said Letters Patent is hereby corrected as shown below:

In the Claims:

Claim 16, Column 14, Line 1, please delete "give" and substitute -- given --

Signed and Sealed this
Thirtieth Day of June, 2015

Michelle K. Lee
*Director of the United States Patent and Trademark Office*